(12) United States Patent
Tang et al.

(10) Patent No.: US 11,587,891 B2
(45) Date of Patent: Feb. 21, 2023

(54) CERAMIC SEMICONDUCTOR PACKAGE SEAL RINGS

(71) Applicant: TEXAS INSTRUMENTS INCORPORATED, Dallas, TX (US)

(72) Inventors: Yiqi Tang, Allen, TX (US); Li Jiang, Allen, TX (US); Rajen Manicon Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 4 days.

(21) Appl. No.: 17/335,010

(22) Filed: May 31, 2021

(65) Prior Publication Data
US 2022/0384369 A1    Dec. 1, 2022

(51) Int. Cl.
*H01L 23/58* (2006.01)
*H01L 23/552* (2006.01)
*H01L 23/00* (2006.01)

(52) U.S. Cl.
CPC .......... *H01L 23/585* (2013.01); *H01L 23/552* (2013.01); *H01L 23/562* (2013.01); *H01L 23/564* (2013.01)

(58) Field of Classification Search
CPC ... H01L 23/585; H01L 23/552; H01L 23/562; H01L 23/564
See application file for complete search history.

(56) References Cited

U.S. PATENT DOCUMENTS

| 5,574,314 A | * | 11/1996 | Okada | H01L 23/66 257/730 |
| 2010/0060373 A1 | * | 3/2010 | Takagi | H01P 7/06 29/600 |
| 2010/0091477 A1 | * | 4/2010 | Takagi | H01L 23/66 438/106 |

* cited by examiner

*Primary Examiner* — Peniel M Gumedzoe
(74) *Attorney, Agent, or Firm* — Dawn Jos; Frank D. Cimino

(57) ABSTRACT

In examples, a semiconductor package comprises a ceramic substrate and first and second metal layers covered by the ceramic substrate. The first metal layer is configured to carry signals at least in a 20 GHz to 28 GHz frequency range. The package comprises a semiconductor die positioned above the first and second metal layers and coupled to the first metal layer. The package comprises a ground shield positioned in a horizontal plane between the semiconductor die and the first metal layer, the ground shield including an orifice above a portion of the first metal layer. The package includes a metal seal ring coupled to a top surface of the ceramic substrate, the metal seal ring having a segment that is vertically aligned with a segment of the ground shield. The segment of the ground shield is between the orifice of the ground shield and a horizontal center of the ground shield. The package comprises a metal lid coupled to a top surface of the metal seal ring.

14 Claims, 18 Drawing Sheets

CERAMIC SEMICONDUCTOR PACKAGE SEAL RINGS

BACKGROUND

Semiconductor chips are often housed inside packages that protect the chips from deleterious environmental influences, such as heat, moisture, and debris. A packaged chip generally communicates with electronic devices outside the package via conductive members (e.g., leads) that are exposed to surfaces of the package. Some packages include substrates on which the semiconductor die is positioned. The substrate may include multiple metal layers, or traces, that carry electrical signals or power.

SUMMARY

In examples, a semiconductor package comprises a ceramic substrate and first and second metal layers covered by the ceramic substrate. The first metal layer is configured to carry signals at least in a 20 GHz to 28 GHz frequency range. The package comprises a semiconductor die positioned above the first and second metal layers and coupled to the first metal layer. The package comprises a ground shield positioned in a horizontal plane between the semiconductor die and the first metal layer, the ground shield including an orifice above a portion of the first metal layer. The package includes a metal seal ring coupled to a top surface of the ceramic substrate, the metal seal ring having a segment that is vertically aligned with a segment of the ground shield. The segment of the ground shield is between the orifice of the ground shield and a horizontal center of the ground shield. The package comprises a metal lid coupled to a top surface of the metal seal ring.

In examples, a method comprises forming a ceramic substrate including a cavity; a first metal layer below a floor of the cavity, the first metal layer configured to conduct signals having a frequency ranging from 2 GHz to 38 GHz; and a ground shield positioned between the first metal layer and the floor of the cavity, the ground shield having a recessed area abutting an empty space, the empty space in a same horizontal plane as the ground shield. The method includes coupling a device side of a semiconductor die to a conductive terminal extending through a floor of the cavity, a clearance between 1 millimeter and 3 millimeters in the horizontal plane circumscribing the semiconductor die. The method comprises plating a metal layer on a top surface of the ceramic substrate. The method includes forming a metal seal ring on the metal layer, the seal ring vertically aligned with the ground shield and not vertically aligned with the empty space.

DETAILED DESCRIPTION

Figure 1A:
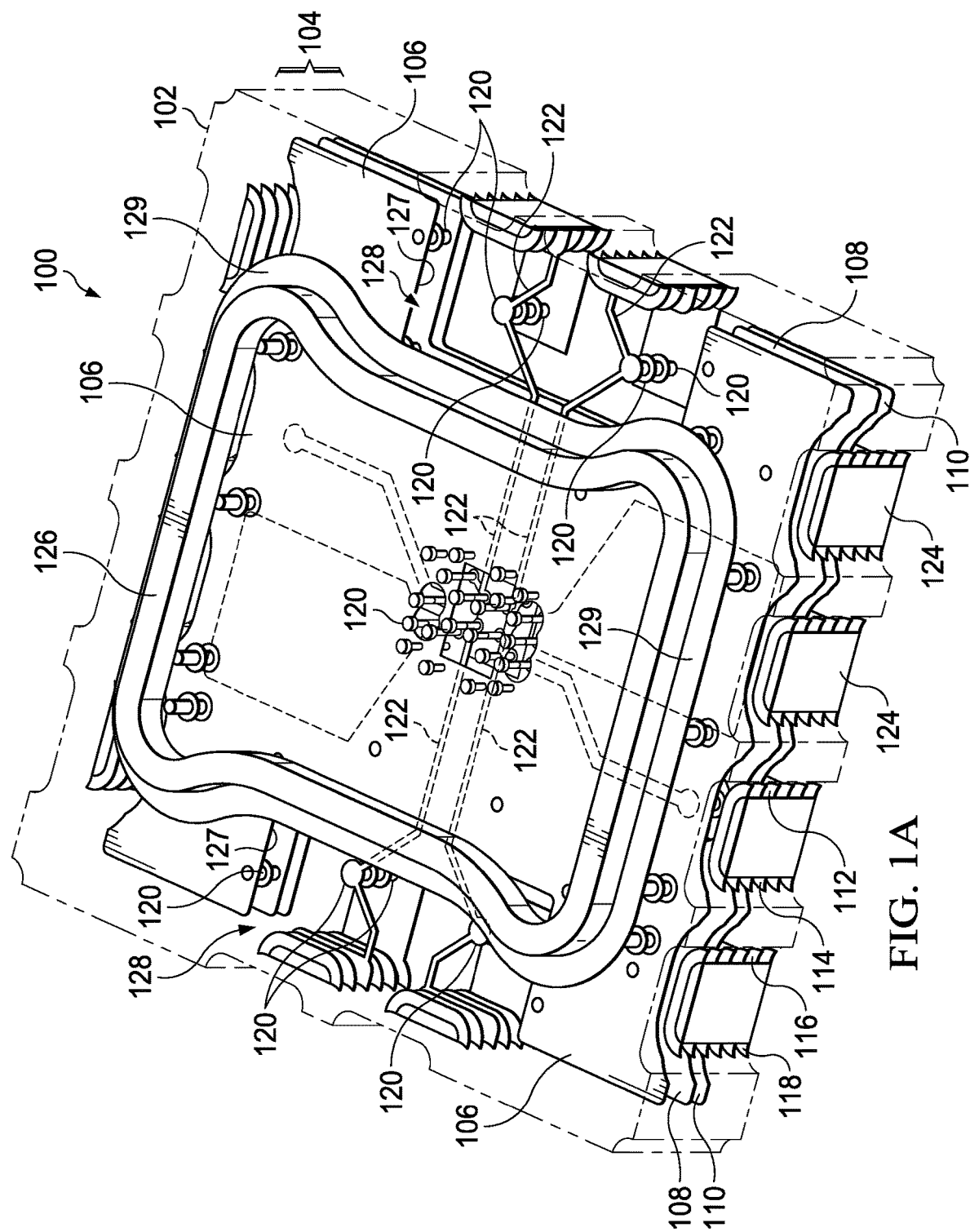
FIG. 1A is a perspective view of a ceramic semiconductor package having seal rings in accordance with various examples.

Ceramic semiconductor packages are hermetically sealed packages containing ceramic substrates that cover multiple metal layers. A ceramic substrate in such a package may include a cavity at the top of the package, and a semiconductor die may be positioned on the floor of this cavity. The metal layers of the ceramic substrate may be coupled to each other and to the semiconductor die through a network of metallic vias. One or more of the metal layers may include a trace that is configured to carry high-frequency signals, such as in the 5 GHz to 40 GHz range. A ground shield may be positioned between the semiconductor die and the high-frequency signal trace to provide a return path for the high-frequency signal trace. However, in many cases, the ground shield may include an orifice or a recessed area abutting an empty space to reduce parasitic capacitance. This orifice or empty space may be referred to as a ground cut. The orifice or recessed area exposes the high-frequency signal trace to other metallic structures, and more particularly, to a seal ring that is used in conjunction with a metal lid to hermetically seal the semiconductor die cavity. As a result, the high-frequency signal trace and the seal ring become electromagnetically coupled, causing interference and degraded performance.

This disclosure describes various examples of a semiconductor package in which the seal ring is vertically aligned with the ground shield and is not vertically aligned with the ground shield orifice or with the empty space abutting the recessed area of the ground shield. More particularly, an example semiconductor package includes a ceramic substrate and first and second metal layers covered by the ceramic substrate. The first metal layer is configured to carry signals at least in the 2 GHz to 38 GHz frequency range. The package includes a semiconductor die positioned above the first and second metal layers and coupled to the first metal layer. The package includes a ground shield positioned in a horizontal plane between the semiconductor die and the first metal layer. The ground shield includes an orifice above a portion of the first metal layer. The package includes a seal ring coupled to a top surface of the ceramic substrate. The seal ring has a segment that is vertically aligned with a segment of the ground shield. The segment of the ground shield is between the orifice of the ground shield and a horizontal center of the ground shield. The package includes a metal lid coupled to a top surface of the seal ring. As a result of this lack of vertical alignment between the seal ring and the ground shield orifice, or empty space through which the high-frequency signal trace is exposed, the electromagnetic coupling and interference challenges described above are mitigated, thereby preserving the functional integrity of the semiconductor package. The package described herein is useful in a variety of high-speed applications, such as radio frequency amplifiers and radio frequency synthesizers.

FIG. 1A is a semi-transparent, perspective view of a ceramic semiconductor package 100 having seal rings in accordance with various examples. The package 100 includes a ceramic substrate 102 and a set of metal layers 104. The metal layers include, from top to bottom, metal layers 108, 110, 112, 114, 116, and 118. FIG. 1A omits portions of at least some of the metal layers in the set of metal layers 104 for simplicity and clarity. For example, the metal layer 118 may be exposed to a bottom surface of the package 100. In examples, the various metal layers in the set of metal layers 104 have varying configurations, depending on the particular application for which the package 100 is designed. A ground shield 106 is positioned above the top-most metal layer in the set of metal layers 104, which, in examples, is the metal layer 108. The ground shield 106 is to provide a return path for high-frequency signal traces (such as high-frequency signal traces 122, described below). Vias 120 couple different metal layers in the set of metal layers 104 to other metal layers in the set of metal layers 104. Some vias 120 may couple different metal layers in the set of metal layers 104 to a semiconductor die (not expressly shown in FIG. 1A). One of the metal layers in the set of metal layers 104, such as the top-most metal layer 108, includes metal high-frequency signal traces 122. In examples, the signal traces 122 are configured to carry signals that have high frequency (e.g., 2 GHz to 38 GHz, or in the range of 20 GHz to 28 GHz, or in a range that includes at least a sub-range of 20 GHz to 28 GHz, with the significance of these ranges explained below). The package 100 further includes metal contacts 124, which couple to one or more of the metal layers in the set of metal layers 104. The metal contacts 124 are exposed to an exterior of the package 100 to facilitate electrical coupling of the one or more metal layers to other components and devices, such as signal traces and electronic devices on a printed circuit board (PCB) to which the package 100 is coupled.

The package 100 includes a metal seal ring 126. In examples, the metal seal ring 126 is composed of an iron-nickel-cobalt alloy, although other metals and alloys also may be used. In examples, the metal seal ring 126 is plated to protect the metal seal ring 126, for example, using a suitable plating alloy such as nickel-gold. In examples, the metal seal ring 126 has multiple members that are coupled to form a polygonal shape. For instance, the metal seal ring 126 may have a rectangular shape. In some examples, the metal seal ring 126 has an hourglass shape, meaning that two members of the metal seal ring 126 oppose each other and are approximately parallel to each other, and that two members of the metal seal ring 126 oppose each other and curve toward a horizontal center of the package 100, as shown. In some examples, the members of the metal seal ring 126 that curve toward the horizontal center of the package 100 may have portions that are parallel to each other. In examples, the metal seal ring 126 has rounded corners, and in other examples, the metal seal ring 126 has non-rounded corners or a combination of rounded and non-rounded corners. Other shapes for the metal seal ring 126 are contemplated, such as a circular or ovoid shape. In examples, the metal seal ring 126 has a vertical thickness ranging from 50 microns to 500 microns, with thicknesses above this range being disadvantageous because of increased costs and taller package profiles, which are undesirable, and with thicknesses below this range being disadvantageous because they compromise hermetic performance. In examples, the metal seal ring 126 has a horizontal width ranging from 250 microns to 500 microns, with widths above this range being disadvantageous because of increased costs and a reduction in the maximum die size that can be accommodated, and with widths below this range being disadvantageous because of compromised hermetic performance. In examples, the metal seal ring 126 is positioned on a metal (e.g., plated) layer 129, which is plated on a top surface of the ceramic substrate 102. In examples, the metal layer 129 has the same or a similar shape as the metal seal ring 126. In examples, the metal layer 129 is horizontally wider than the metal seal ring 126. In examples, the metal layer 129 has a horizontal width ranging from 0.5 mm to 2 mm, with a width greater than this range being disadvantageous because of unacceptably increased costs, and with a width less than this range being disadvantageous because of significant difficulties in manufacturing.

The ground shield 106 includes recessed areas 127 that result in the formation of empty spaces 128 in the horizontal plane of the ground shield 106, as shown. Although the term empty space is used herein, it is meant to indicate the recessed nature of the ground shield 106, and in some examples the empty spaces 128 may be empty while in other examples the empty spaces 128 may be filled with a dielectric or other suitable material. Irrespective of the presence or absence of such material in the empty space, the term empty space is nevertheless used for simplicity and consistency. The metal seal ring 126 is horizontally separated from each of the empty spaces 128 by at least 0.45 mm. The empty spaces 128 expose the signal traces 122 to the spaces directly above (e.g., in vertical alignment with) the empty spaces 128. Despite this exposure, the high-frequency signals carried on the signal traces 122 do not electromagnetically couple with, and thus do not interfere with, the metal seal ring 126. This is because the metal seal ring 126 is shaped and sized so the metal seal ring 126 is vertically aligned with the ground shield 106 but is not vertically aligned with the empty spaces 128. Stated in another way, the metal seal ring 126 has a segment that is vertically aligned with a segment of the ground shield 106, where the segment of the ground shield 106 is positioned between an empty space 128 of the ground shield 106 and a horizontal center of the ground shield 106. In examples, a minimum horizontal distance between the empty space 128 and the metal seal ring 126 is 0.45 mm, with a lesser distance being disadvantageous because it makes the metal seal ring 126 and the signal traces 122 unacceptably vulnerable to electromagnetic coupling and interference. In examples, a minimum vertical distance between the signal traces 122 and the metal seal ring 126 is 0.75 mm, with a lesser distance being disadvantageous because it makes the metal seal ring 126 and the signal traces 122 unacceptably vulnerable to electromagnetic coupling and interference.

Figure 1B:
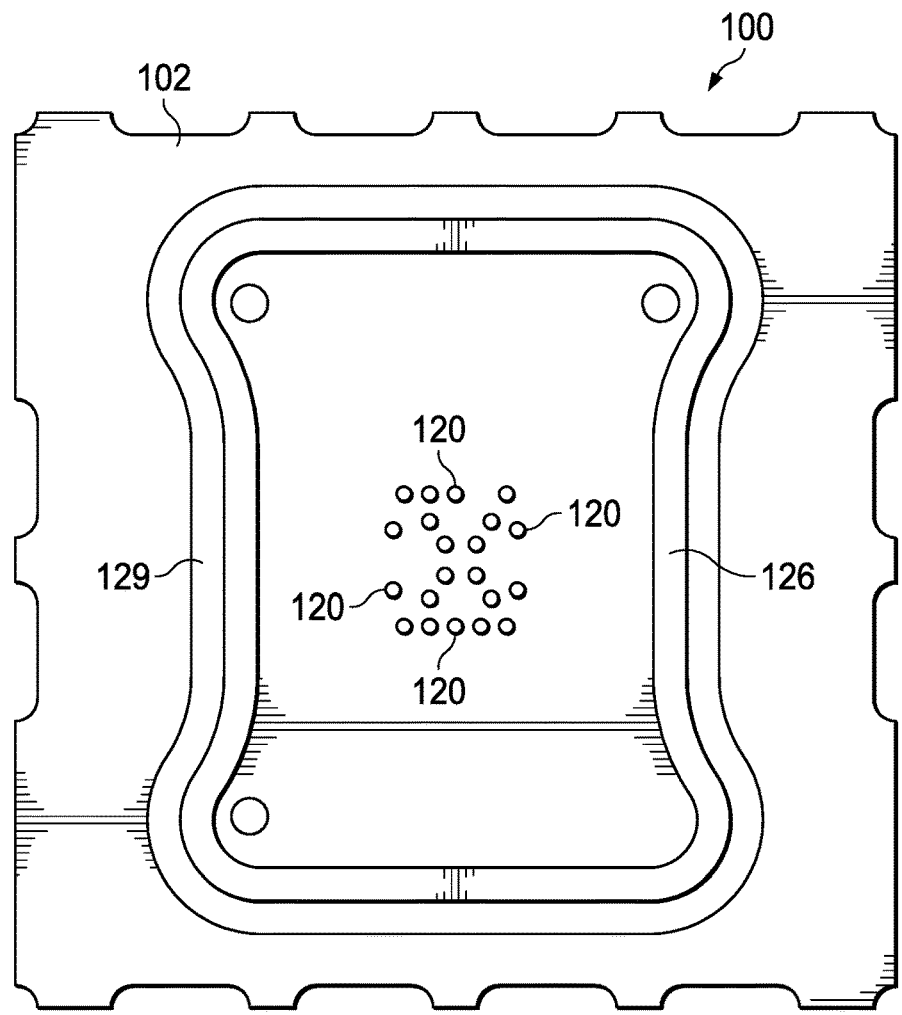
FIG. 1B is a top-down view of a ceramic semiconductor package having seal rings in accordance with various examples.
Figure 1C:
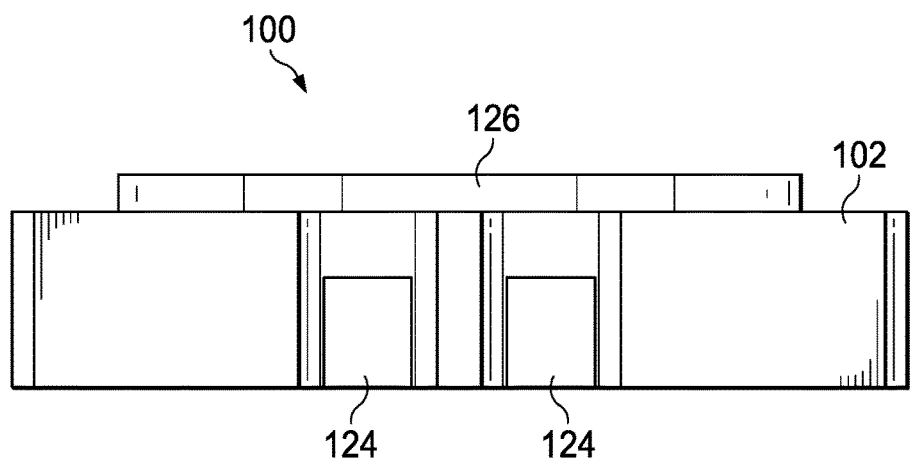
FIG. 1C is a profile view of a ceramic semiconductor package having seal rings in accordance with various examples.

FIG. 1B is a top-down view of the ceramic semiconductor package 100 in accordance with various examples. FIG. 1C is a profile view of the ceramic semiconductor package 100 in accordance with various examples.

In operation, a semiconductor die (not expressly shown in FIGS. 1A-1C) coupled to the vias 120 extending vertically through the center of the ground shield 106 transmits and receives high-frequency signals on the high-frequency signal traces 122. The potential for unintentional electromagnetic coupling between the signal traces 122 and the metal seal ring 126 is mitigated by the fact that no portion of the metal seal ring 126 is vertically aligned with the empty space 128 through which the signal traces 122 are exposed. Rather, the metal seal ring 126 is vertically aligned with the ground shield 106. The potential for the aforementioned unintentional electromagnetic coupling is further mitigated by the minimum horizontal distance between the empty space 128 and the metal seal ring 126 described above, and by the minimum vertical distance between the signal traces 122 and the metal seal ring 126 described above.

Figure 1D:
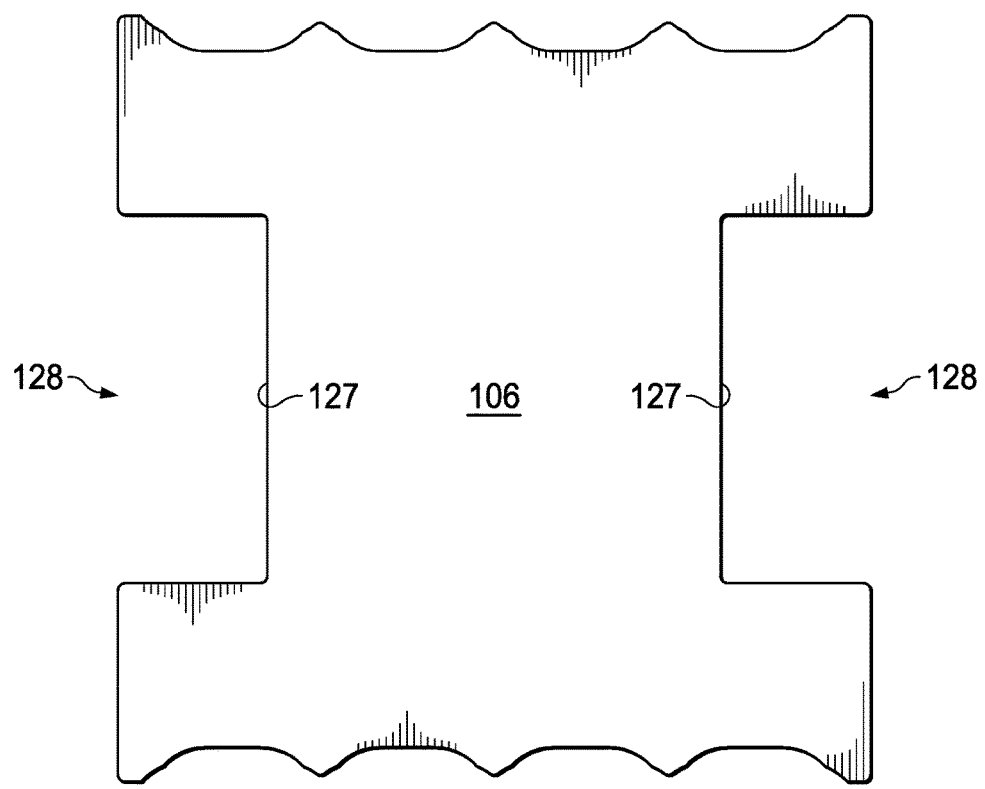
FIGS. 1D and 1E are top-down views of ground shields in accordance with various examples.
Figure 1E:
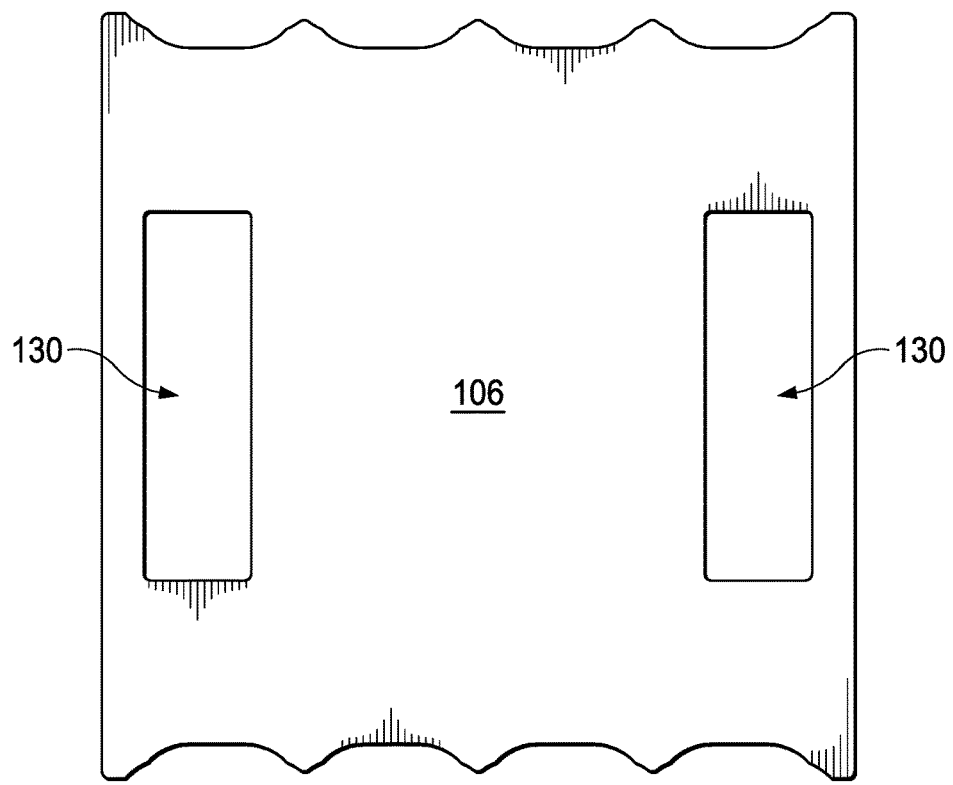

FIGS. 1D and 1E are top-down views of ground shields 106 in accordance with various examples. FIGS. 1D and 1E provide a clear and unobstructed view of the shapes of the ground shields 106. The example ground shield 106 in FIG. 1D includes the recessed areas 127 and the empty spaces 128 formed by the recessed areas 127. In other examples, such as in FIG. 1E, orifices 130 may be formed in the ground shield 106 in lieu of empty spaces 128. In such examples, the description provided above with reference to the empty spaces 128 also applies to the orifices 130. The metal seal ring 126 is positioned at least 0.25 mm horizontally away from each of the orifices 130. Although only two empty spaces 128 are shown in FIG. 1D, any number of empty spaces 128 may be included, and the shape of the metal seal ring 126 may be adjusted accordingly such that the metal seal ring 126 is not vertically aligned with any empty space 128. Similarly, although only two orifices 130 are shown in FIG. 1E, any number of orifices may be included, and the shape of the metal seal ring 126 may be adjusted accordingly such that the metal seal ring 126 is not vertically aligned with any orifice 130.

Figure 2A:
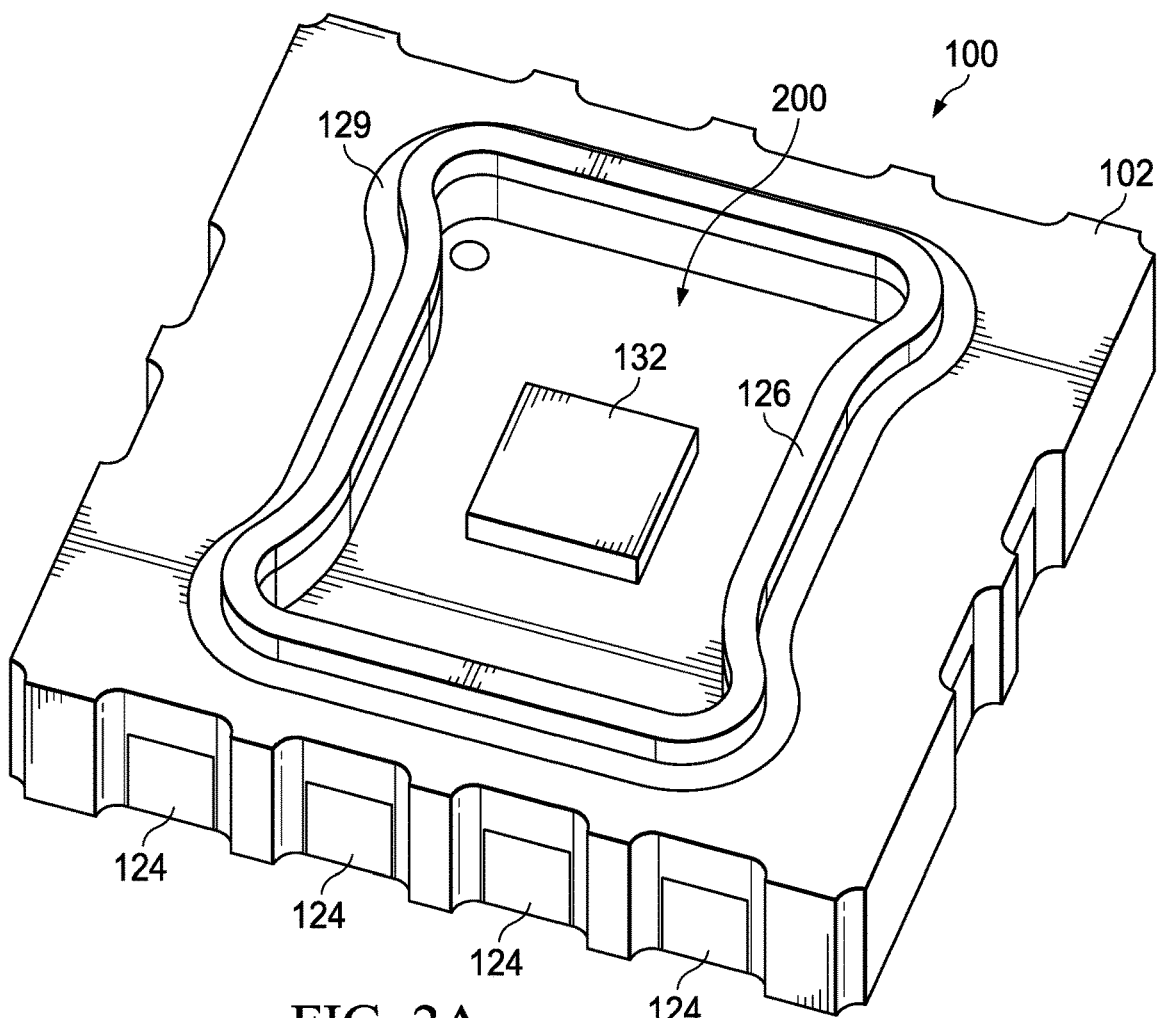
FIG. 2A is a perspective view of a ceramic semiconductor package having seal rings in accordance with various examples.
Figure 2C:
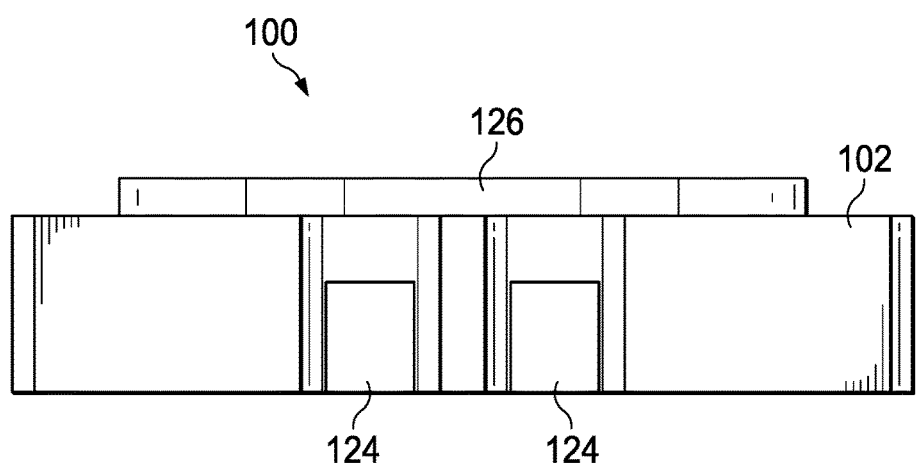
FIGS. 2C and 2D are profile views of ceramic semiconductor packages having seal rings in accordance with various examples.
Figure 2B:
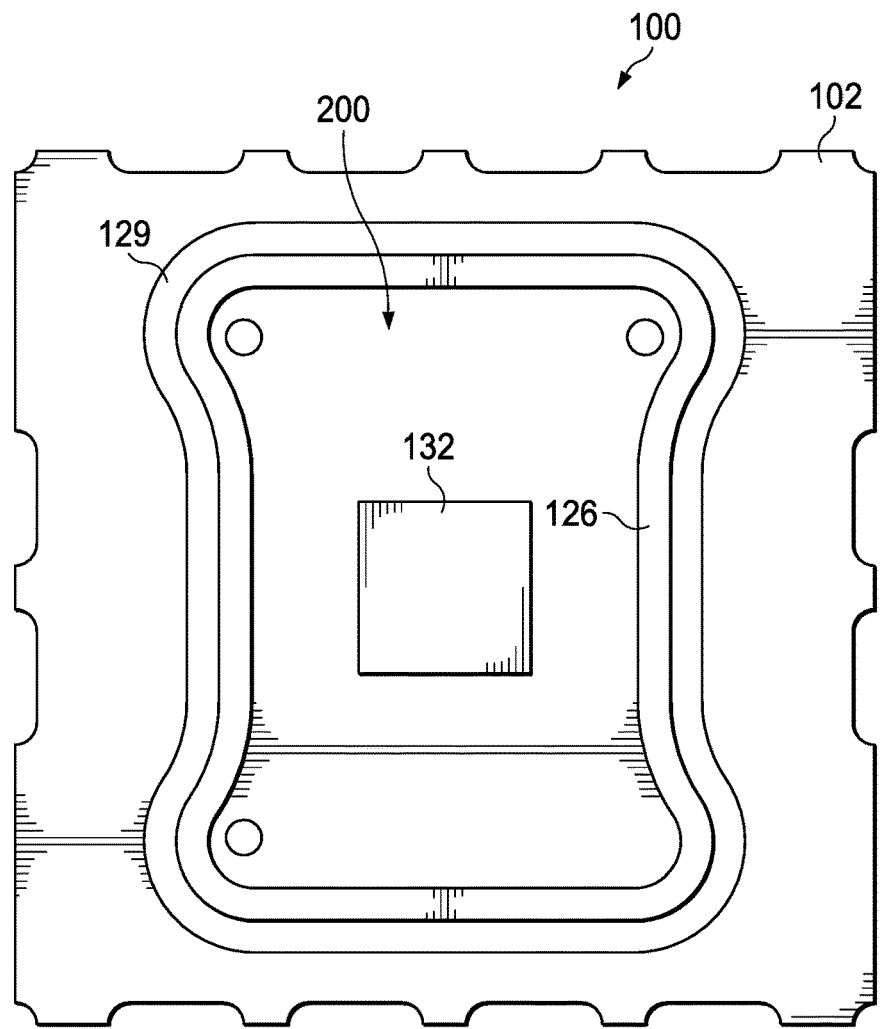
FIG. 2B is a top-down view of a ceramic semiconductor package having seal rings in accordance with various examples.
Figure 2D:
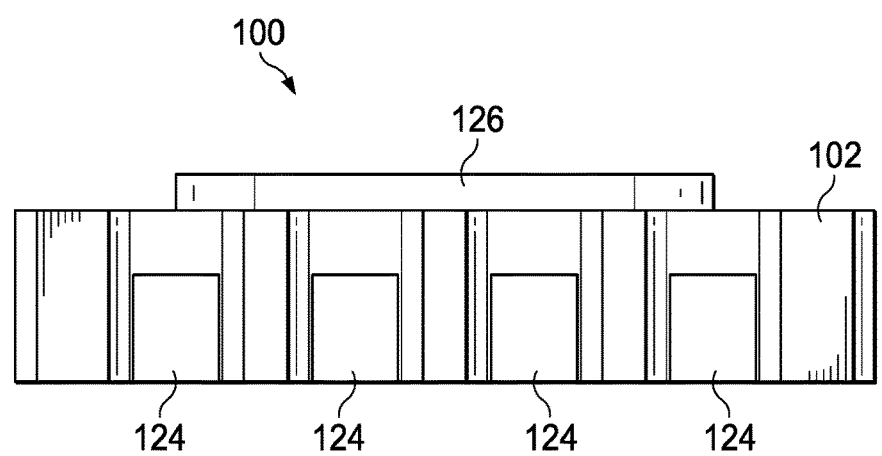

FIG. 2A is a perspective view of a ceramic semiconductor package 100 having seal rings in accordance with various examples. The view shown in FIG. 2A is similar to that of FIG. 1A, except that the package 100 is no longer depicted as being semi-transparent. As shown, the package 100 includes a cavity 200 inside which a semiconductor die 132 is positioned. For example, the semiconductor die 132 may be positioned on a floor of the cavity 200, with conductive terminals on a device side of the semiconductor die 132 coupled to the vias 120 extending through the ground shield 106 (FIG. 1A) and the floor of the cavity 200. The device side of the semiconductor die 132 is the surface of the semiconductor die 132 on and/or in which circuitry is formed. In examples, the cavity 200 has a shape matching that of the metal seal ring 126. For instance, the metal seal ring 126 and the cavity 200 both may have an hourglass shape, or the metal seal ring 126 and the cavity 200 may both have a rectangular shape, or the metal seal ring 126 and the cavity 200 may both have a circular shape. In examples, the metal seal ring 126 and the cavity 200 have different shapes. Regardless of the shapes of the metal seal ring 126 and the cavity 200, the metal seal ring 126 circumscribes the cavity 200 such that the entirety of the cavity 200 is within the bounds of the metal seal ring 126 in the horizontal direction. FIG. 2B is a top-down view of the package 100 in accordance with various examples. FIGS. 2C and 2D are profile views of package 100 in accordance with various examples.

Figure 3A:
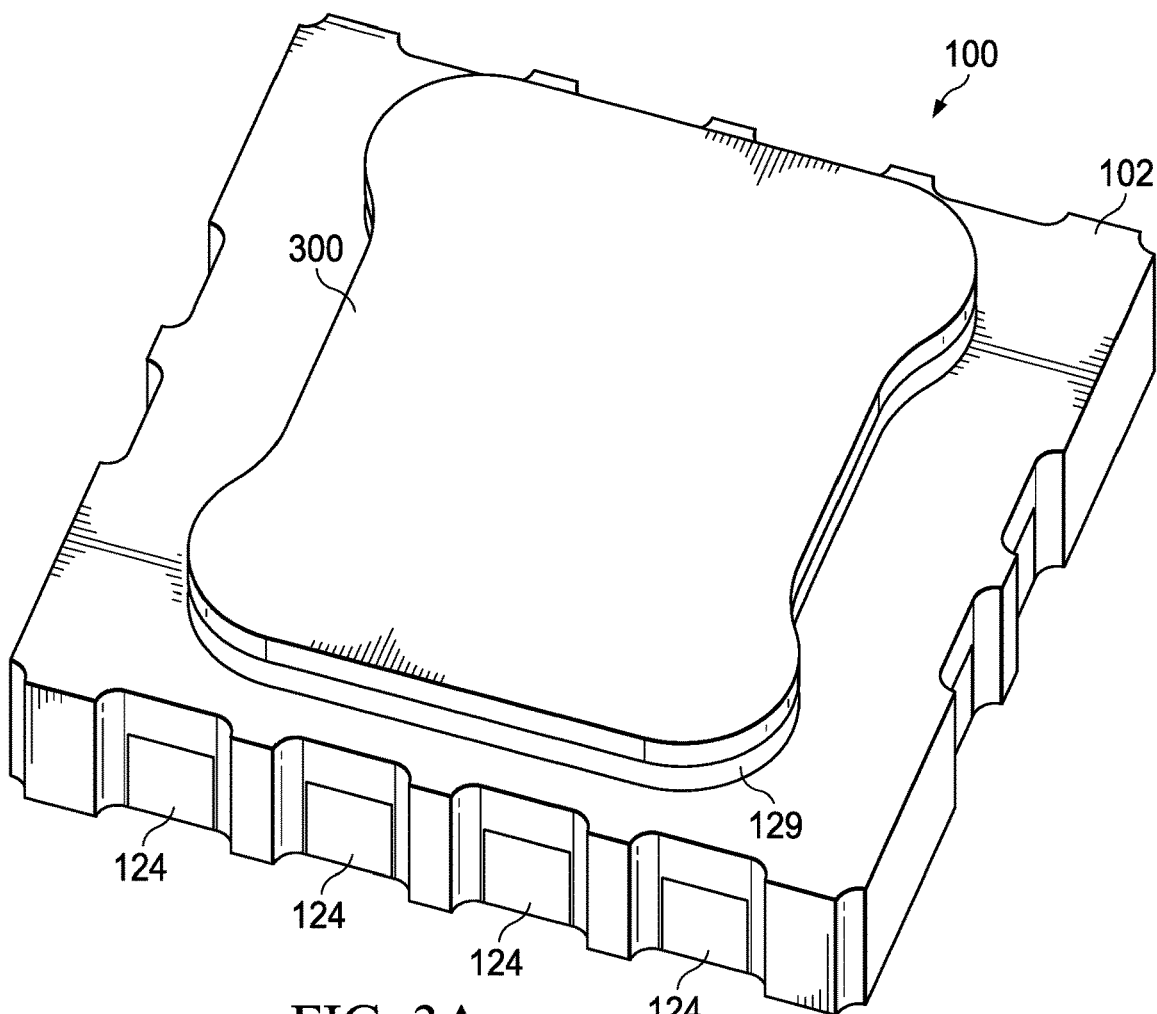
FIG. 3A is a perspective view of a ceramic semiconductor package having a metal lid positioned on a seal ring in accordance with various examples.
Figure 3C:
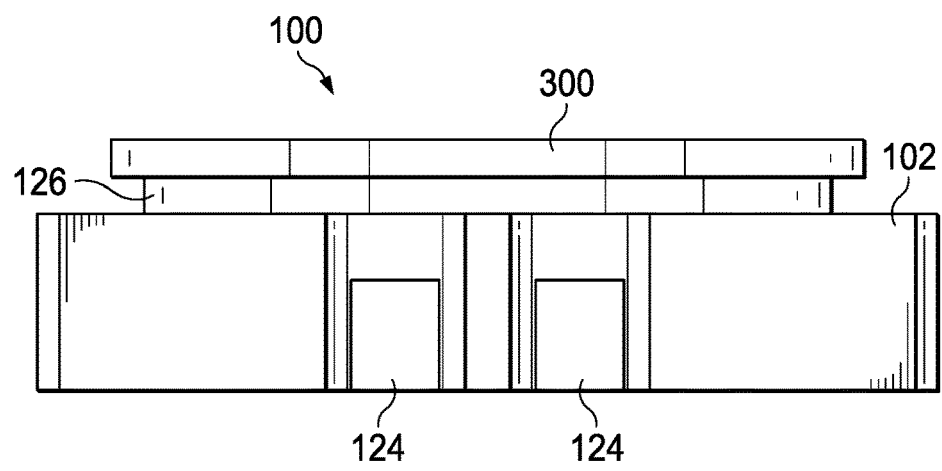
FIGS. 3C and 3D are profile views of a ceramic semiconductor package having a metal lid positioned on a seal ring in accordance with various examples.
Figure 3B:
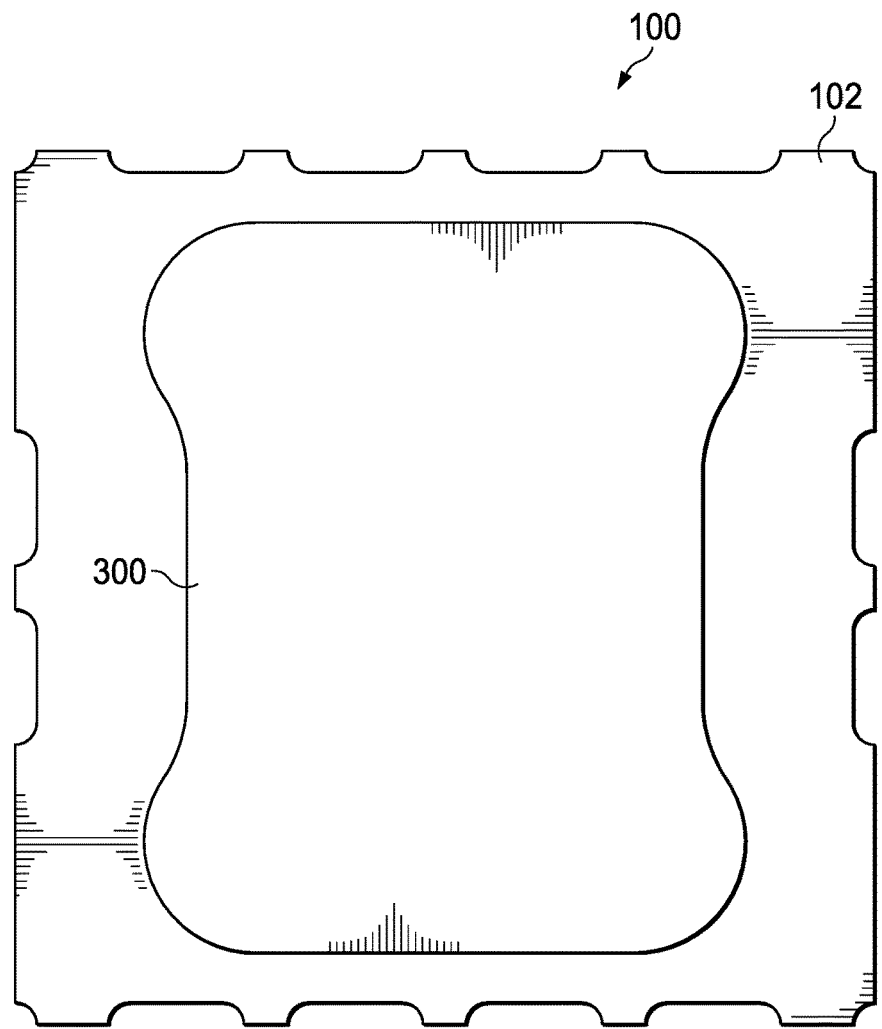
FIG. 3B is a top-down view of a ceramic semiconductor package having a metal lid positioned on a seal ring in accordance with various examples.
Figure 3D:
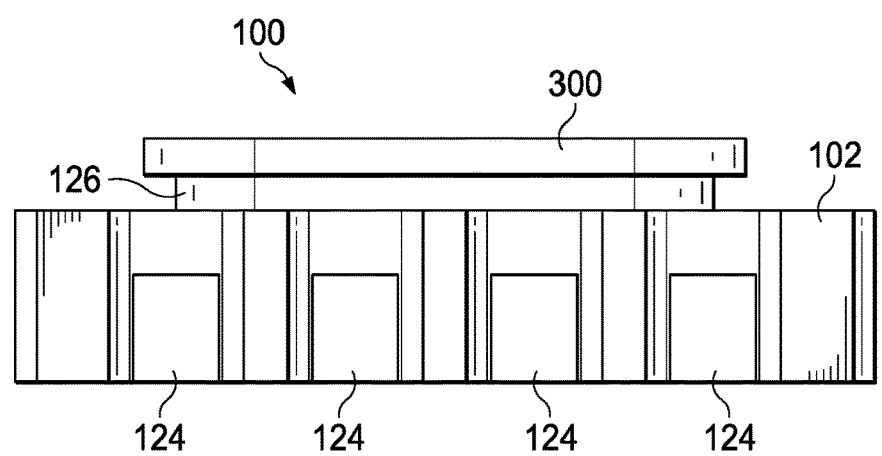

FIG. 3A is a perspective view of the package 100 having a metal lid 300 positioned on and coupled to the seal ring 126 in accordance with various examples. FIG. 3B is a top-down view of the structure of FIG. 3A in accordance with various examples. FIGS. 3C and 3D are profile views of the structure of FIG. 3A in accordance with various examples. As described below, during application of the metal lid 300, the package 100 is hermetically sealed.

Figure 4:
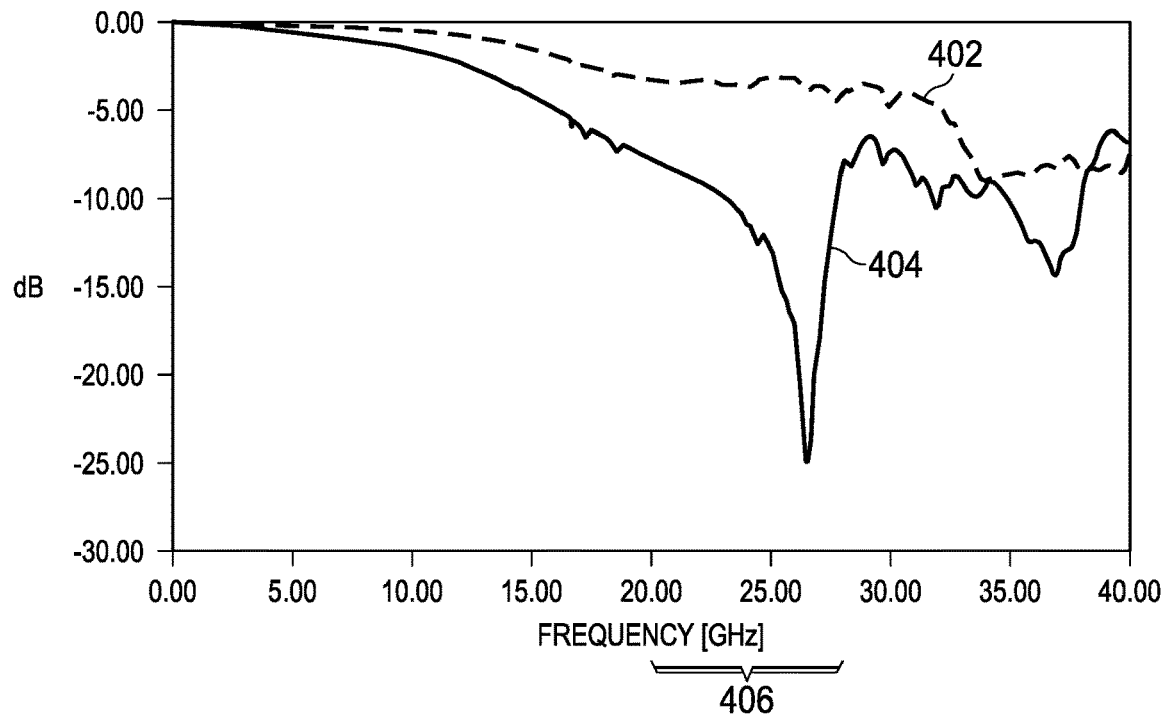
FIG. 4 is a graph depicting insertion losses in conventional ceramic semiconductor packages and in ceramic semiconductor packages having seal rings in accordance with various examples.

FIG. 4 is a graph 400 depicting insertion losses in conventional ceramic semiconductor packages and in ceramic semiconductor packages having seal rings in accordance with various examples, such as those described above in reference to FIGS. 1A-3D. In the context of this disclosure, insertion losses are transmission losses experienced by high frequency signals sent by the semiconductor die 132 (e.g., FIG. 2A) and propagating along the high-frequency signal traces 122. Insertion losses also may include transmission losses experienced by signals sent by another device outside the package 100 and propagating along the signal traces 122 toward the semiconductor die 132. Insertion loss is the loss of signal power resulting from the insertion of a device in a transmission line. Return loss is a measure in relative terms of the power of the signal reflected by a discontinuity in a transmission line. It is desirable to have low insertion loss and high return loss. In FIG. 4, the x-axis indicates frequency in GHz and the y-axis indicates insertion losses in decibels (dB). Curve 404 depicts insertion losses associated with conventional ceramic semiconductor packages, and more specifically, along high-frequency signal traces that are exposed to a seal ring and that electromagnetically couple with the seal ring. In contrast, curve 402 depicts insertion losses associated with the package 100 described herein, and more specifically, along high-frequency signal traces 122, which are not exposed to the metal seal ring 126, as explained above. As graph 400 shows, the insertion losses over the frequency range of 2 GHz to 38 GHz are consistently greater for curve 404 than for curve 402. Outside of this range, the curve 402 does not clearly demonstrate superior insertion losses over the curve 404. The insertion losses in the range of 20 GHz to 28 GHz for the curve 404 (as numeral 406 indicates) are especially pronounced, whereas the insertion losses in the same range of 20 GHz to 28 GHz for the curve 402 are significantly less.

Figure 5:
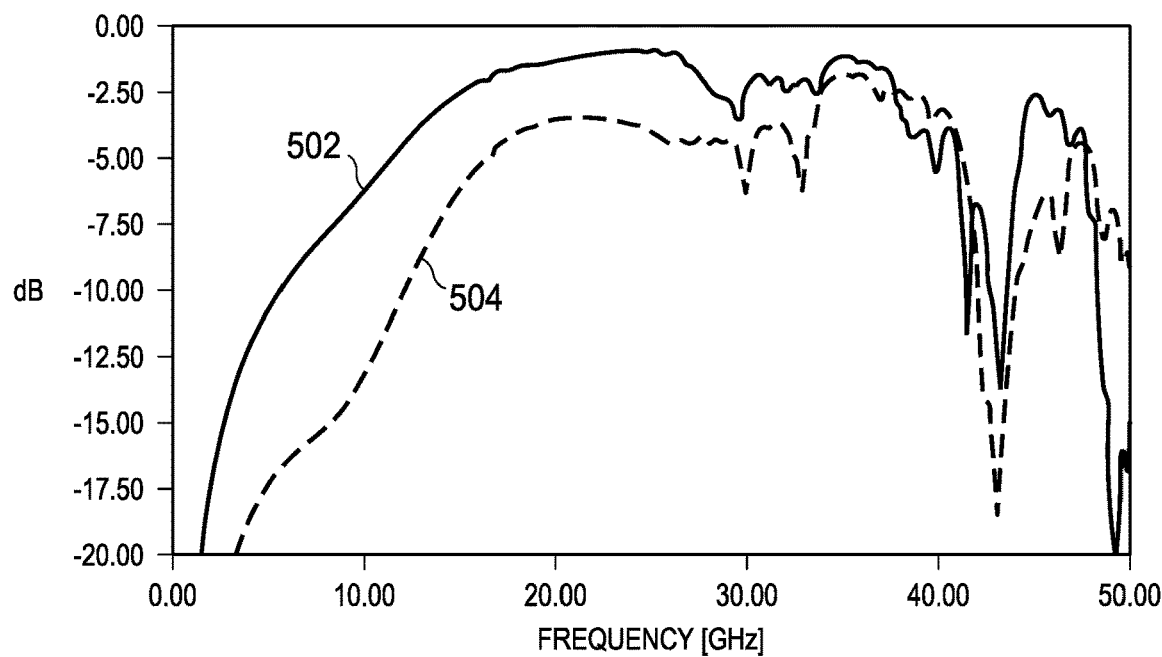
FIG. 5 is a graph depicting return losses in conventional ceramic semiconductor packages and in ceramic semiconductor packages having seal rings in accordance with various examples.

FIG. 5 is a graph 500 depicting return losses in conventional ceramic semiconductor packages and in the package 100 in accordance with various examples. The x-axis indicates frequency in GHz, and the y-axis indicates return losses in dB. Curve 502 indicates return losses for the conventional ceramic semiconductor package, and curve 504 indicates return losses for the package 100. As shown, over the range of 2 GHz to 38 GHz, the curve 504 indicates superior return loss performance relative to the curve 502.

Figure 6A:
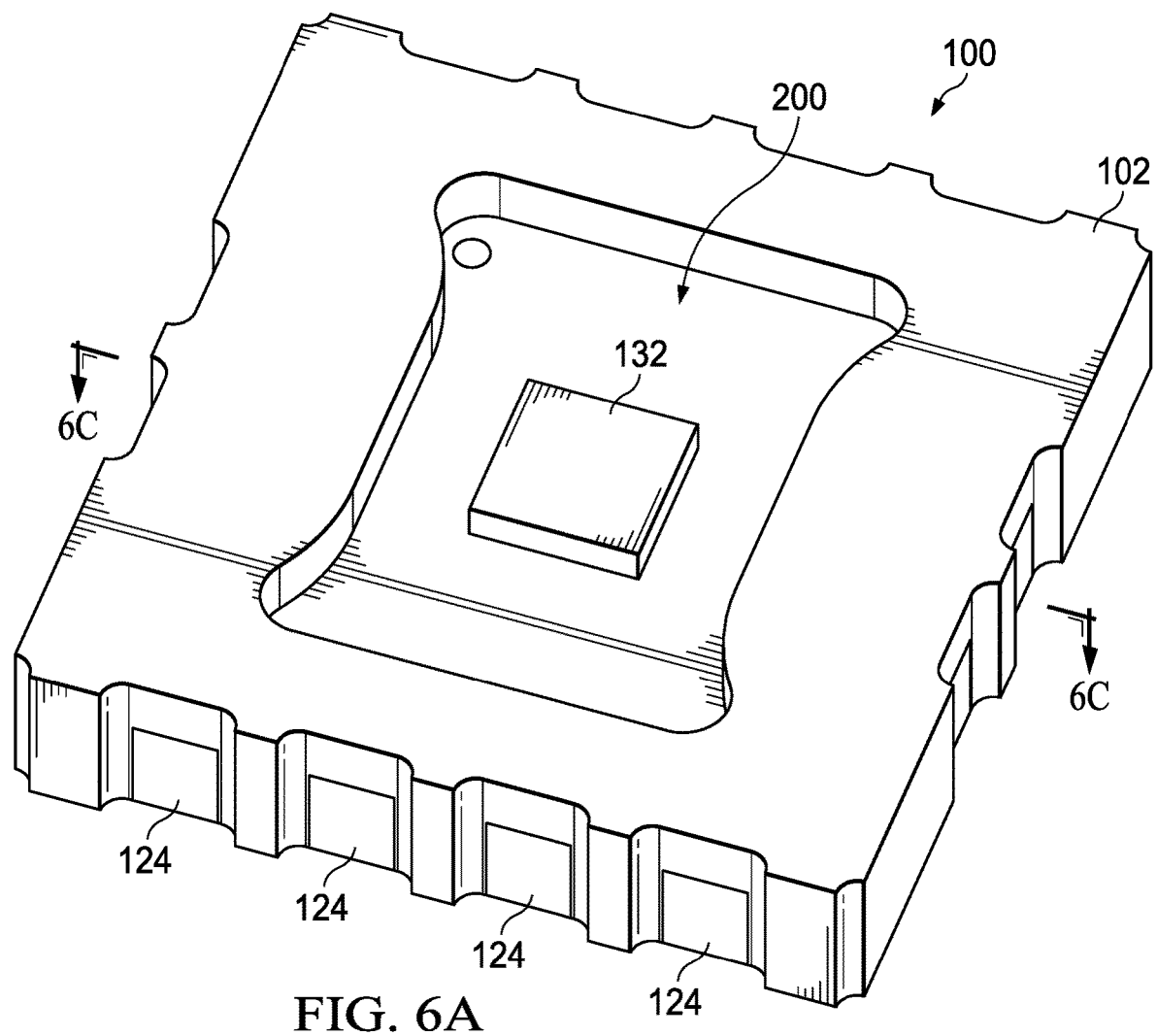
FIGS. 6A-6I are perspective, top-down, and top-down cross-sectional views of a process flow for manufacturing a ceramic semiconductor package having a seal ring in accordance with various examples.
Figure 6B:
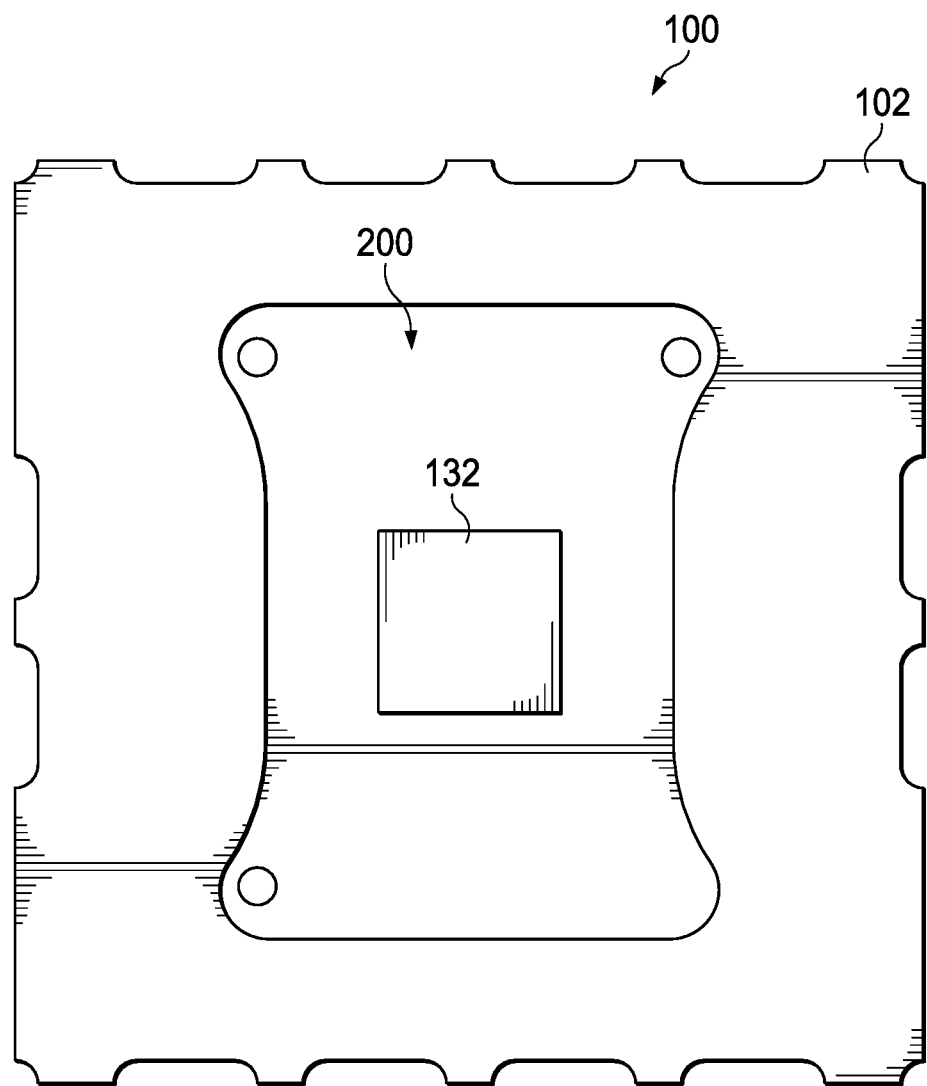
Figure 6C:
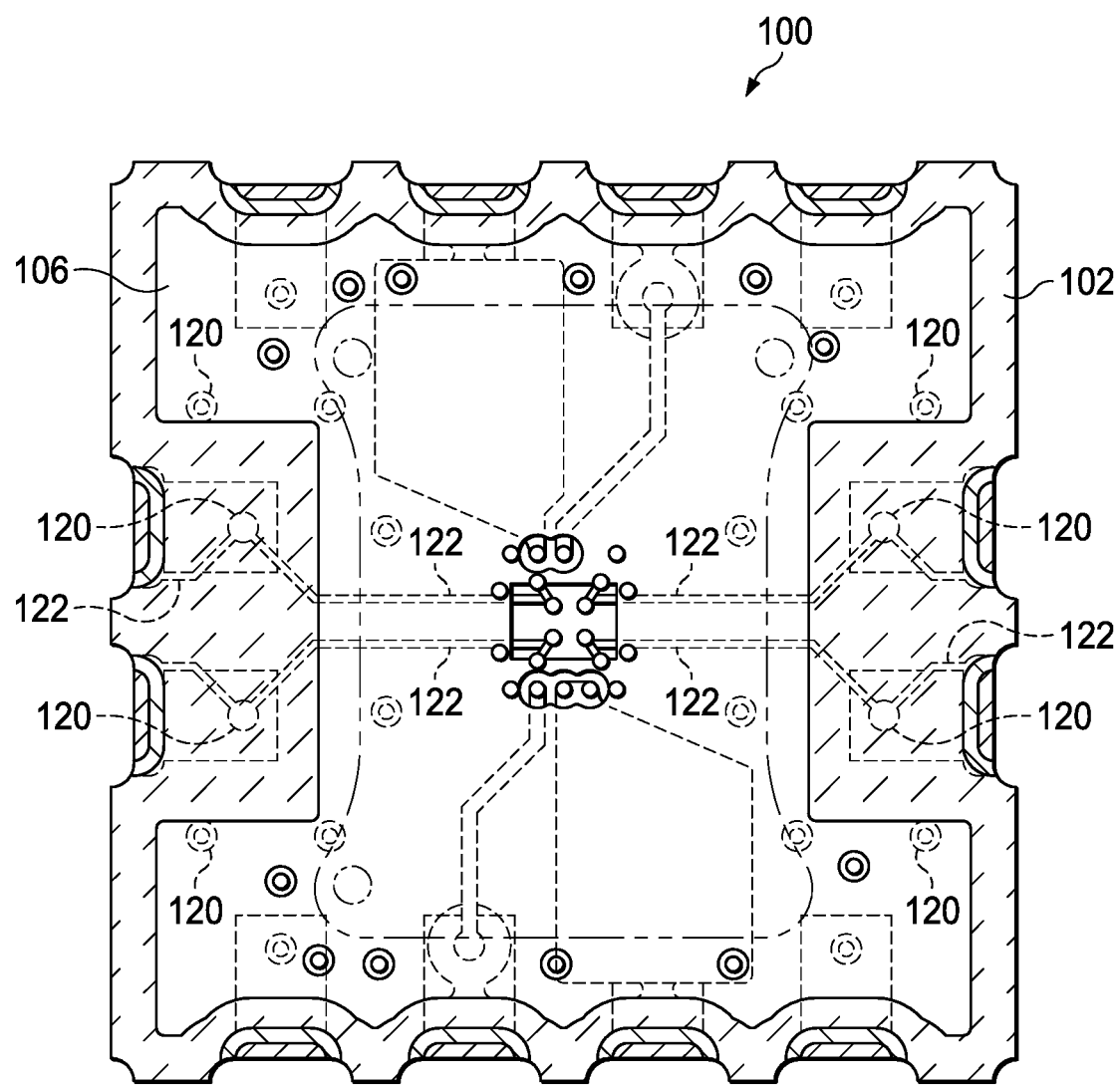
Figure 6D:
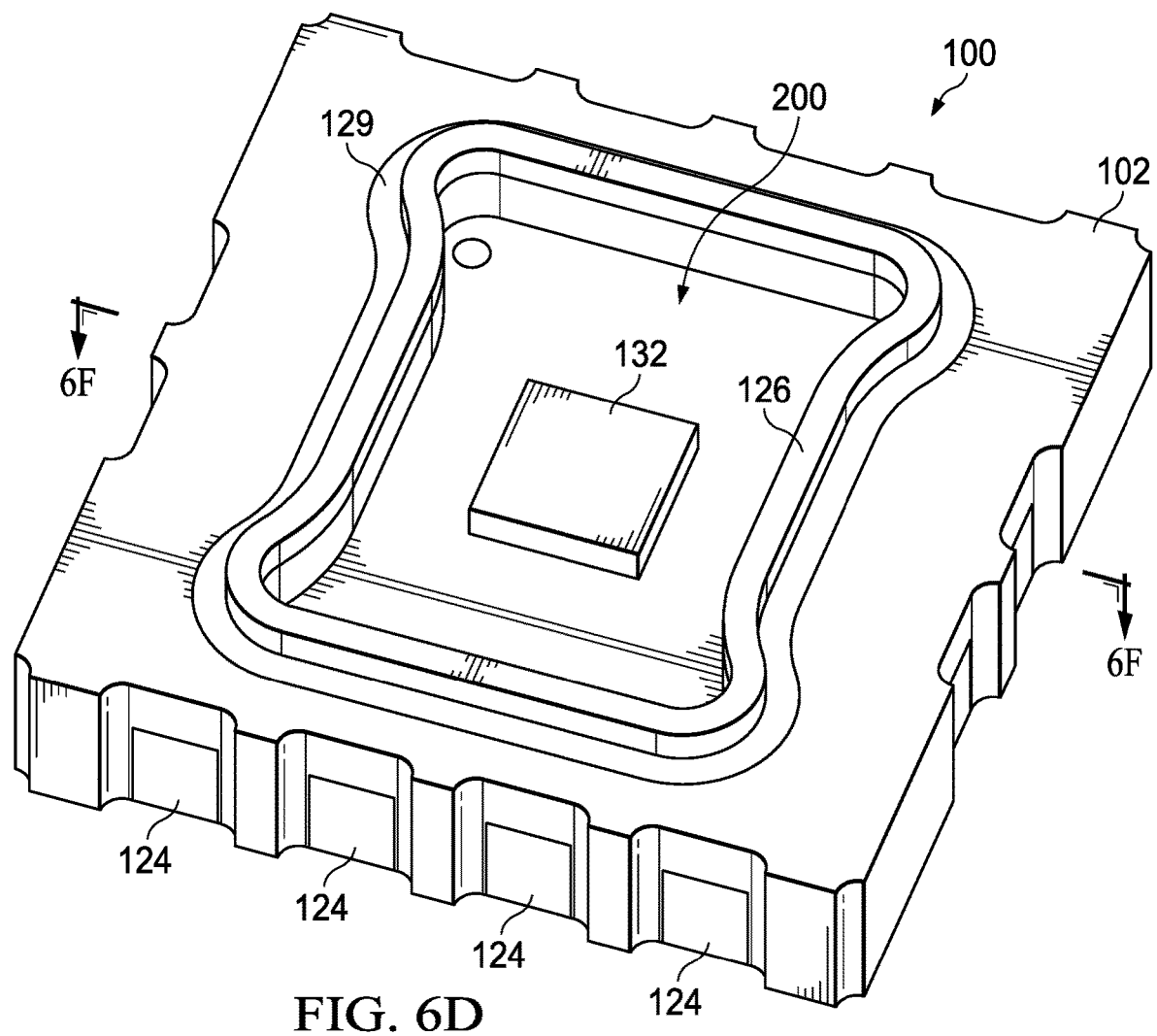
Figure 6E:
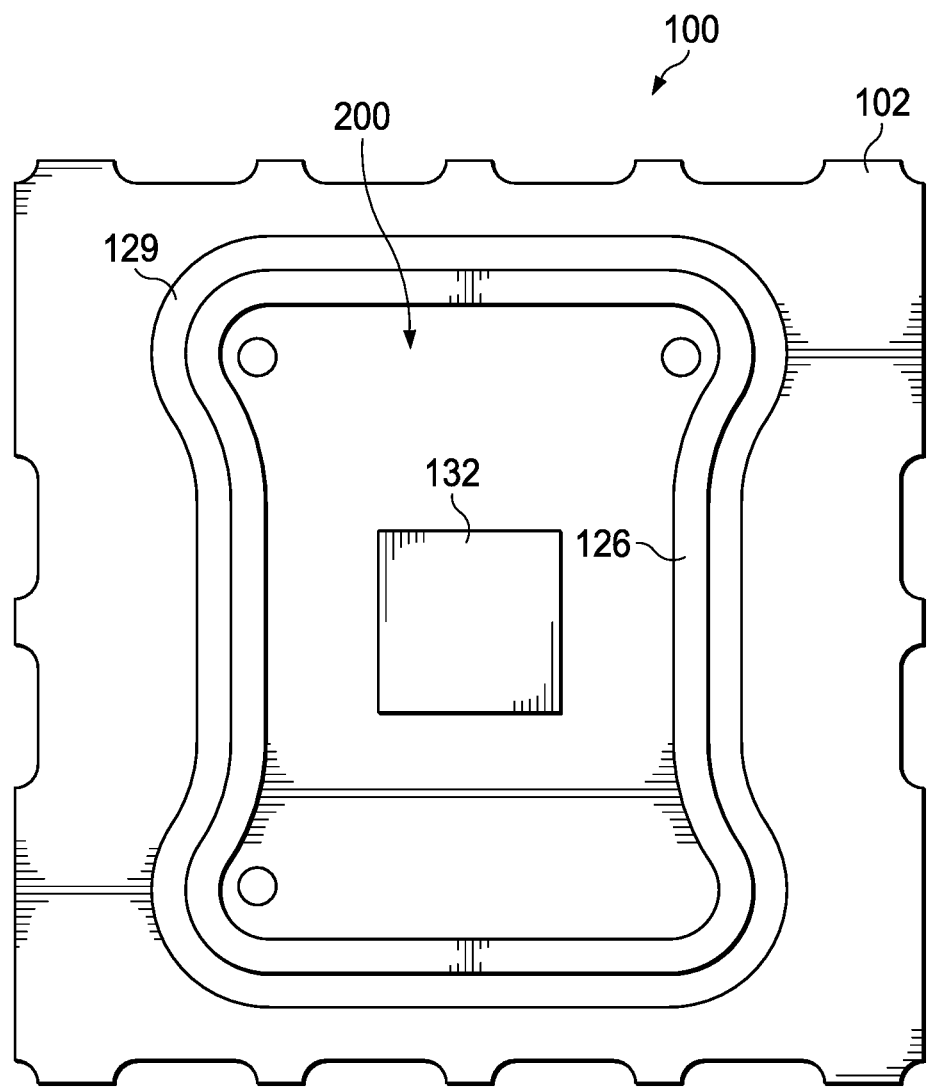
Figure 6F:
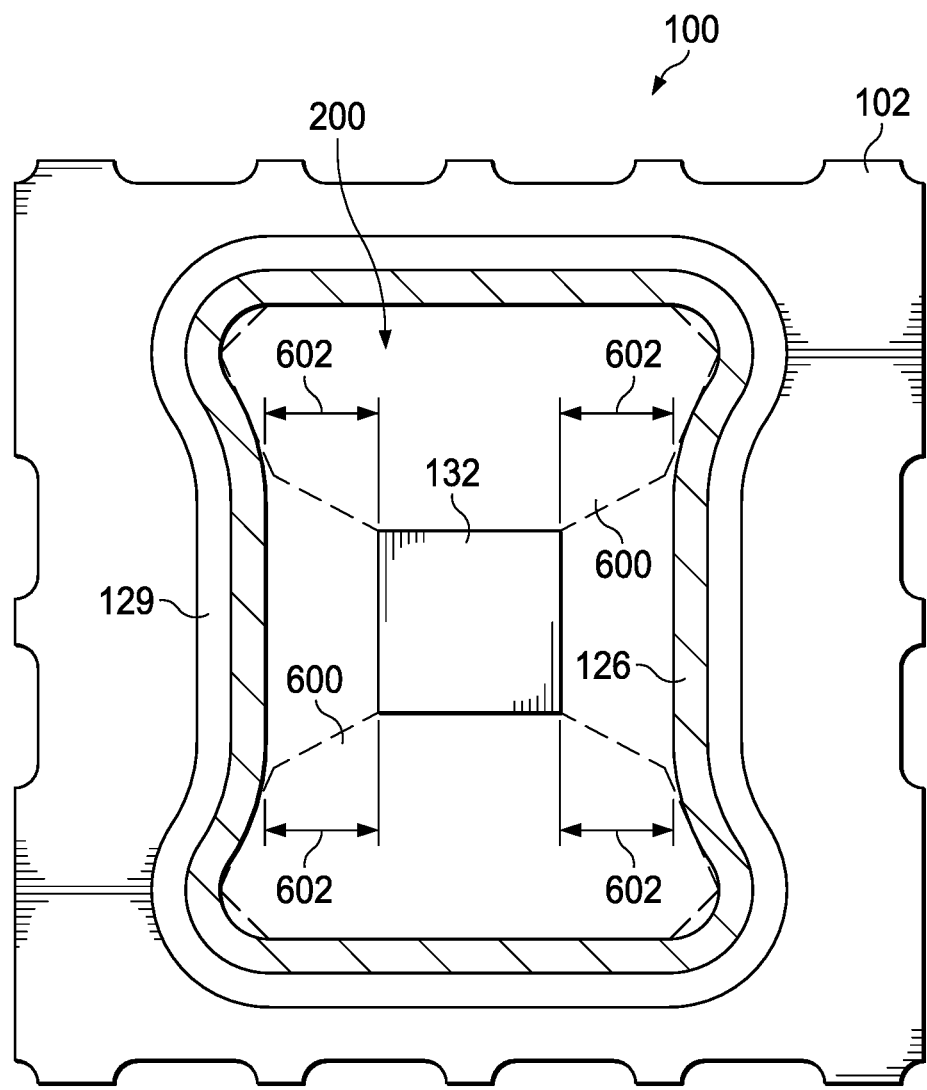
Figure 6G:
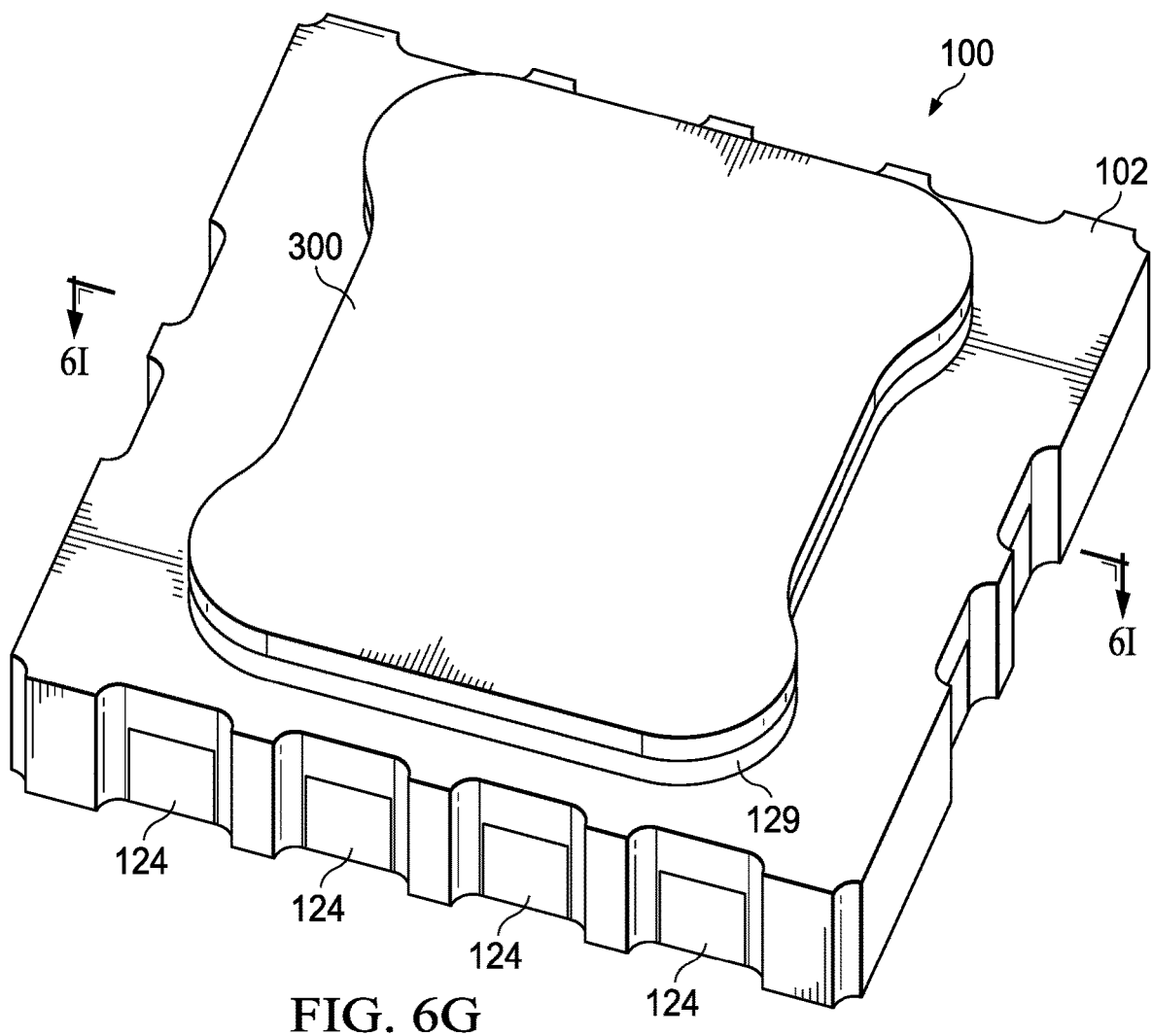
Figure 6H:
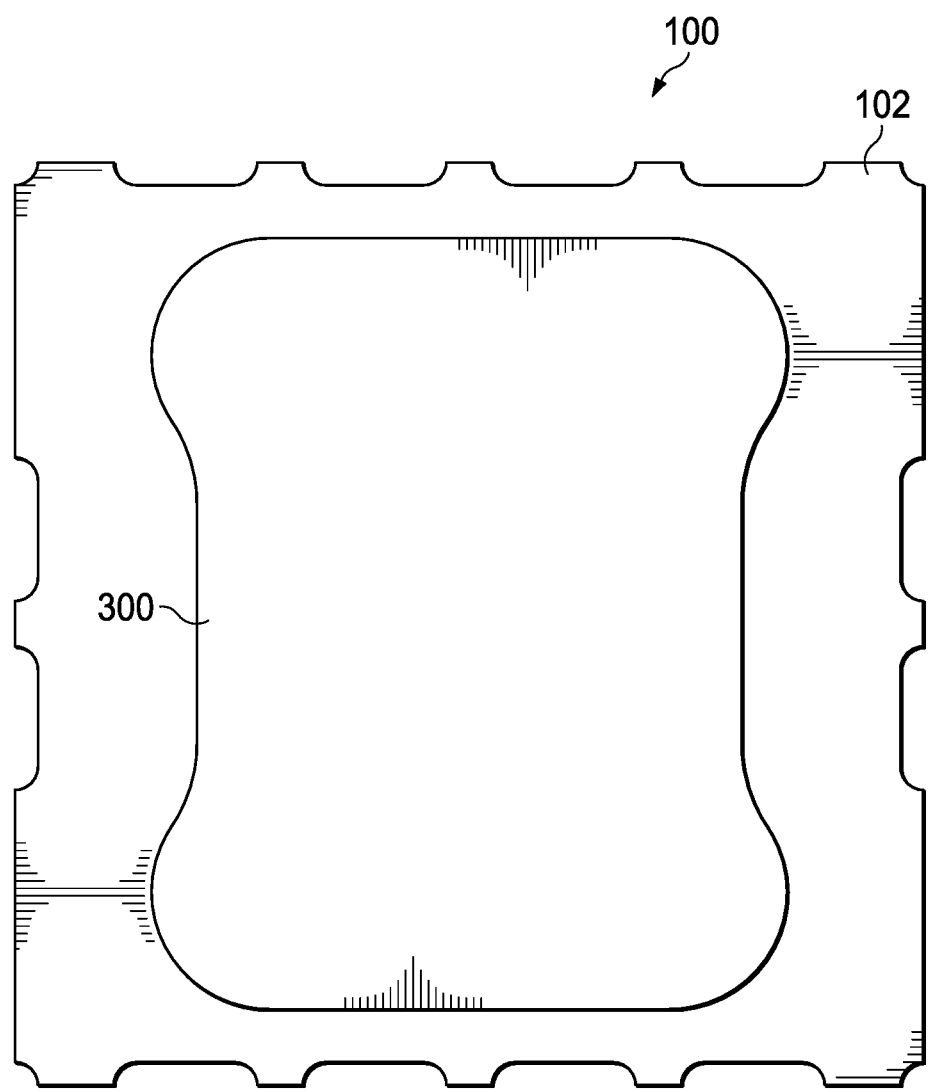
Figure 6I:
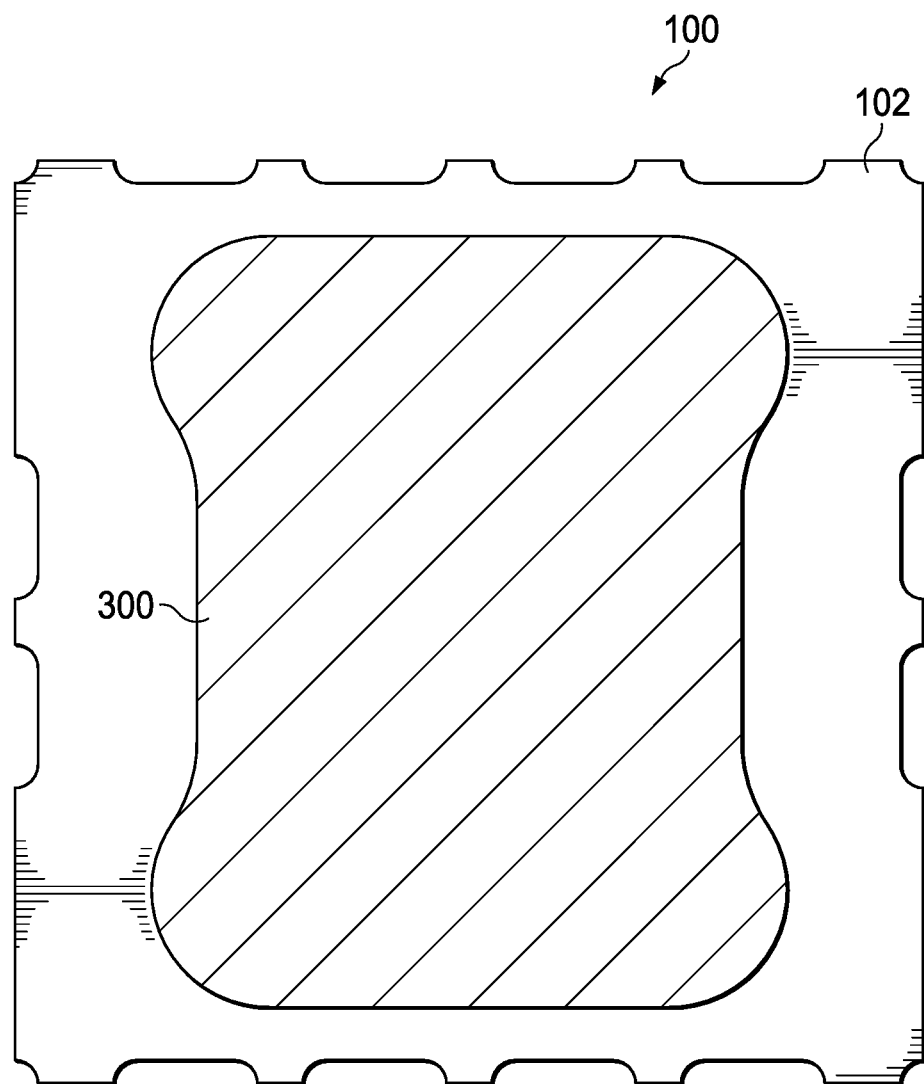
Figure 7:
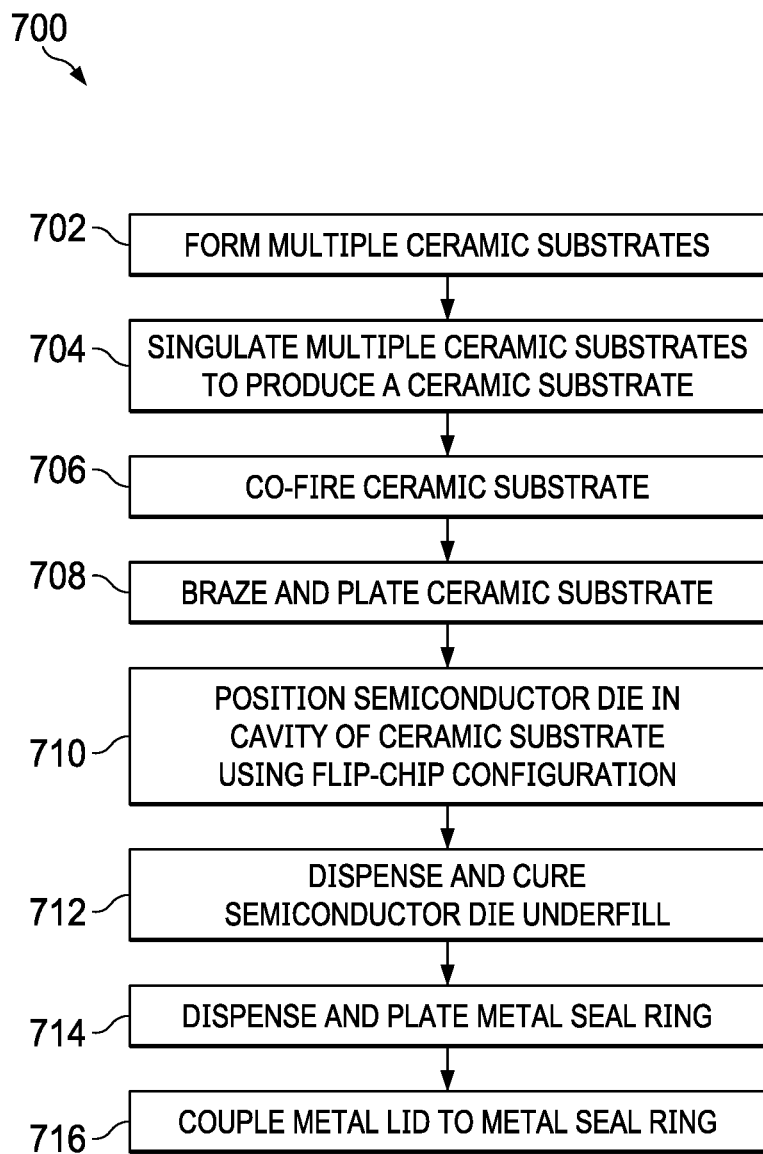
FIG. 7 is a flow diagram of a method for manufacturing a ceramic semiconductor package having a seal ring in accordance with various examples.

FIGS. 6A-6I are perspective, top-down, and top-down cross-sectional views of a process flow for manufacturing a ceramic semiconductor package having a seal ring in accordance with various examples. FIG. 7 is a flow diagram of a method 700 for manufacturing a ceramic semiconductor package having a seal ring in accordance with various examples. Accordingly, the process flow of FIGS. 6A-6I and the method 700 are now described in parallel.

The method 700 begins with forming multiple ceramic substrates (702) that are coupled to each other (e.g., presingulation). The formation of the ceramic substrates is an iterative process, with each iteration including casting raw ceramic material (e.g., powder) to a tape sheet, cutting the ceramic material into a panel, framing the panel, punching vias in the panel, filling the vias with a suitable metal or alloy, performing a screen print to form a metal layer, and laminating the structure produced by the iteration. The method 700 includes singulating the multiple ceramic substrates to produce an individual ceramic substrate (704), co-firing the ceramic substrate at a suitable temperature (706), and brazing and plating the exposed metal (e.g., metal contacts 124) of the ceramic substrate (708).

The method 700 includes positioning a semiconductor die in the cavity of the ceramic substrate using a flip-chip configuration, such that a device side of the semiconductor die is coupled to a floor of the cavity (710). FIG. 6A is a perspective view of the structure produced by performing step 710; FIG. 6B is a top-down view of the structure produced by performing step 710; and FIG. 6C is a top-down cross-sectional view of the structure produced by performing step 710.

The method 700 includes dispensing and curing a semiconductor die underfill (712) and dispensing and plating a metal seal ring (714). FIG. 6D is a perspective view of the structure of FIG. 6C, but with the addition of a semiconductor die underfill (not visible in this view, as it is positioned below the semiconductor die 132), the metal layer 129 on a top surface of the ceramic substrate 102, and the metal seal ring 126 on the metal layer 129. FIG. 6E is a top-down view of the structure of FIG. 6D, and FIG. 6F is a top-down cross-sectional view of the structure of FIG. 6D. In examples, the cavity 200 and the semiconductor die 132 are sized and shaped to provide a clearance of 1-3 millimeters around the perimeter of the semiconductor die 132, as numeral 602 indicates. Providing a minimum distance 1-3 millimeters between the semiconductor die 132 and the cavity 200 on all sides of the semiconductor die 132 provides sufficient space for an underfill capillary to access and fill the underside of the semiconductor die 132 with semiconductor die underfill (e.g., via the regions 600). Providing a clearance less than 1 millimeter results in inadequate space for this purpose, and providing a clearance greater than 3 millimeters results in an unnecessarily large cavity, and thus an unnecessarily large package 100.

The formation of the metal layer 129 may include plating a suitable metal or alloy, such as nickel-gold, on the top surface of the ceramic substrate 102. The formation of the metal seal ring 126 includes dispensing a suitable metal or alloy, such as an iron-nickel-cobalt alloy, on the top surface of the metal layer 129, and subsequently plating the exposed surfaces of the metal seal ring 126 with a suitable metal or alloy, such as nickel-gold.

The method 700 includes coupling a metal lid to the top surface of the metal seal ring (716). Any suitable technique may be used to fuse the metal lid to the metal seal ring, such as an electron beam welding technique. A vacuum may be useful with application of the metal lid to facilitate hermetic sealing. FIG. 6G is a perspective view of the structure of FIG. 6F but with the addition of the metal lid 300. FIG. 6H is a top-down view of the structure of FIG. 6G. FIG. 6I is a top-down cross-sectional view of the structure of FIG. 6G.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof Unless otherwise stated, "about," "approximately," or "substantially" preceding a value means +/−10 percent of the stated value. Modifications are possible in the described examples, and other examples are possible within the scope of the claims.

What is claimed is:

1. A semiconductor package, comprising:
    a ceramic substrate;
    first and second metal layers covered by the ceramic substrate, the first metal layer configured to carry signals at least in a 20 GHz to 28 GHz frequency range;
    a semiconductor die positioned above the first and second metal layers and coupled to the first metal layer;
    a ground shield positioned in a horizontal plane between the semiconductor die and the first metal layer, the ground shield including an orifice above a portion of the first metal layer;
    a metal seal ring coupled to a top surface of the ceramic substrate, the metal seal ring having a segment that is vertically aligned with a segment of the ground shield, wherein the segment of the ground shield is between the orifice of the ground shield and a horizontal center of the ground shield; and
    a metal lid coupled to a top surface of the metal seal ring.

2. The semiconductor package of claim 1, further comprising a clearance of between 1 mm and 3 mm horizontally circumscribing the semiconductor die.

3. The semiconductor package of claim 1, wherein the metal seal ring is positioned at least 0.25 mm horizontally away from the orifice.

4. The semiconductor package of claim 1, wherein the metal seal ring has an hourglass shape.

5. The semiconductor package of claim 1, wherein the metal seal ring has a rectangular shape.

6. The semiconductor package of claim 1, wherein the ceramic substrate includes a cavity in which the semiconductor die is positioned, and wherein the cavity has an hourglass shape.

7. The semiconductor package of claim 1, wherein the metal seal ring and the first metal layer are separated by at least 0.75 mm vertically.

8. A semiconductor package, comprising:
    a substrate;
    a metal layer covered by the substrate, the metal layer configured to carry signals in a 2 GHz to 38 GHz frequency range;
    a semiconductor die coupled to the metal layer;
    a ground shield between the metal layer and the semiconductor die, the ground shield having a recessed area along a perimeter of the ground shield and abutting an empty space in a same horizontal plane as the ground shield, the empty space vertically aligned with a first segment of the metal layer, the ground shield aligned with a second segment of the metal layer more proximal to a center of the semiconductor package than the first segment;

a metal seal ring vertically aligned with the ground shield and not vertically aligned with the empty space; and a metal lid coupled to a top surface of the metal seal ring.

9. The semiconductor package of claim 8, further comprising a clearance of between 1 mm and 3 mm horizontally circumscribing the semiconductor die.

10. The semiconductor package of claim 8, wherein the metal seal ring and the empty space are horizontally separated by at least 0.45 mm.

11. The semiconductor package of claim 8, wherein the metal seal ring has an hourglass shape.

12. The semiconductor package of claim 8, wherein the substrate includes a cavity in which the semiconductor die is positioned, and wherein the cavity has an hourglass shape.

13. The semiconductor package of claim 8, wherein the metal seal ring and the metal layer are separated by at least 0.75 mm vertically.

14. The semiconductor package of claim 8, wherein the metal seal ring is vertically aligned with a segment of the ground shield that is horizontally positioned between the empty space and a horizontal center of the ground shield.

* * * * *